United States Patent [19]

Ondria

[11] 4,222,014
[45] Sep. 9, 1980

[54] MICROWAVE/MILLIMETERWAVE OSCILLATOR USING TRANSFERRED ELECTRON DEVICE

[75] Inventor: John Ondria, Bethlehem, Pa.

[73] Assignee: Alpha Industries, Inc., Woburn, Mass.

[21] Appl. No.: 973,001

[22] Filed: Dec. 26, 1978

[51] Int. Cl.² .......................... H03B 7/14; H03B 9/12
[52] U.S. Cl. ............................... 331/107 DP; 331/96; 331/107 G
[58] Field of Search ............... 331/96, 107 DP, 107 G

[56] References Cited

U.S. PATENT DOCUMENTS 3,878,480  4/1975  Hulderman et al. ..... 331/107 DP X
4,048,589  9/1977  Knox et al. ................... 331/107 DP

OTHER PUBLICATIONS

Lee et al., "Avalanche Diode Circuits," 1968 International Solid-State Circuits Conference, Pennsylvania, Feb. 16, 1968, pp. 156–157.

Primary Examiner—Siegfried H. Grimm
Attorney, Agent, or Firm—Charles Hieken

[57] ABSTRACT

A microwave/millimeterwave oscillator includes a transferred electron device adapted to operate at a first frequency. The device is housed in a waveguide transmission line in a quarter wavelength, quasi-radial mode cavity dimensioned to enable the device to oscillate at a second frequency, higher then the first frequency.

6 Claims, 2 Drawing Figures

MICROWAVE/MILLIMETERWAVE OSCILLATOR USING TRANSFERRED ELECTRON DEVICE

BACKGROUND OF THE INVENTION

The present invention relates in general to microwave/millimeterwave oscillators and more particularly to microwave/millimeterwave oscillators using a transferred electron device (TED) tunable over a relatively broad frequency range while delivering appreciable power.

Solid state oscillators using transferred electron devices (TED's) or "Gunn-effect" devices have attracted widespread attention due to their small size, low noise characteristics, and low cost as compared to other available microwave oscillator arrangements; e.g., klystrons, magnetrons and backward wave tubes. Essentially, such oscillators comprise a small specimen of a particular semiconductor material having a multivalley conduction band system adapted to generate current oscillations in the microwave range when subjected to electric fields in excess of a critical, or threshold intensity, $E_T$. According to the present theory, a high electric field region, or domain, forms within the semiconductive specimen when subjected to electric fields in excess of the critical intensity $E_T$ due to a redistribution of electric fields within the specimen. Such redistribution of electric fields is a result of a transfer of charge carriers from a high mobility conduction band to a low mobility conduction band under the influence of applied electric fields in excess of the critical intensity $E_T$. A nucleated domain is sustained and propagated along the semiconductive specimen by electric fields greater than a sustaining intensity $E_S$, which is less than the critical intensity $E_T$. The presence of a domain has the effect of reducing the overall conductance of the semiconductive specimen; the magnitude of the current flow through the semiconductive specimen varies according to the presence and absence of a domain. Accordingly, a constant voltage of particular magnitude applied across the semiconductive specimen is effective to nucleate and propagate domains in successive, or cyclic fashion, whereby current through such specimen and, hence, along a series-connected load, varies periodically in the form of coherent current oscillations. The theory of the "Gunn-effect" device has ben described more fully in "Theory of Negative-Conductance Amplification and of Gunn Instabilities in 'Two-Valley' Semiconductor" by D. E. McCumber et al., IEEE Transactions of Electron Devices, Vol. ED-13, No. 1, January 1966.

The frequency of current oscillations generated by oscillators of the "Gunn-effect" type operated in the traveling domain, or transit-time, mode depends upon the device length, L, and propagation velocity, V, of the domains along the active region, i.e., V/L, where V is about $10^7$ cm/sec. There is a further requirement for traveling domain oscillations in n-type gallium-arsenide (GaAs) that the product of the ionized donor density, and the device length, L, exceed $10^{12}$ cm$^{-2}$. Present day technology limits the useful upper frequency of oscillators using GaAs "Gunn-effect" devices to about 70 GHz. Further, if the propagation velocity or drift velocity, V, is increased in an attempt to increase transit time frequency, by reducing device bias voltage, the output power of the oscillator is drastically reduced. This occurs since peak power voltage $V_p = \epsilon L$, where $\epsilon$ is the electric field satisfying the transit-time requirement, along with device threshold voltage $E_T = 3.2$ KV/cm $\times$ L, are correspondingly reduced. Since r.f. voltage swings cannot go much below threshold, their maximum excursions are only a few tenths of a volt, and the corresponding output power is insignificant.

Heretofore, TED's have been used in oscillator circuits designed to provide positive resistance equal to the TED negative resistance at the frequency of resonance. The TED has been supplied with direct current through an r.f. choke or low pass filter and has provided an output signal determined by particular TED dimensions as disclosed in U.S. Pat. No. 3,365,583 issued to J. B. Gunn. A microwave circuit employing a "Gunn-effect" device mounted on a radial-line resonant hat and subsequently housed in a waveguide section is described by T. G. Ruttan, in "Gunn-diode oscillator at 96 GHz." Electron Lett Vol. 2, pp. 293-294, 1975 and in "High frequency Gunn oscillators," IEEE Trans. Microwave Theory Tech., Vol. MTT 22, pp. 142-144, Feb. 1974.

It is an important object of the invention to provide an improved TED oscillator.

It is another object of the invention to provide a high frequency TED oscillator circuit with a TED having physical dimensions optimized for oscillating in a fundamental mode at a much lower frequency that is relatively easy and inexpensive to manufacture.

SUMMARY OF THE INVENTION

According to the invention, a microwave/millimeterwave oscillator comprises a waveguide transmission line having a predetermined impedance and a broad wall. A transferred electron device (TED) having a predetermined impedance and adapted to operate at a first frequency is disposed within the waveguide transmission line in a predetermined position. The device has a first terminal with a flange electrically connected to ground potential and a second terminal electrically connected to a disc within the waveguide above the device. The disc is dimensioned to form a quarter wavelength quasi-radial mode cavity with the flange to enable the device to oscillate at a second frequency higher than the first frequency. Means is connected to the device for coupling a D.C. bias signal to the device to cause the device to oscillate at the second frequency. Means is connected to the device for varying the disc position above the broad wall to vary the second frequency of device oscillation. Movable tuning means is disposed within the waveguide substantially $(2n+1)$ $\lambda/4$ from the device position for matching the impedance of the device to the waveguide impedance. Numerous other features, objects and advantages of the invention will become apparent from the following specification when read in connection with the accompanying drawing in which:

DETAILED DESCRIPTION OF PREFERRED EMBODIMENTS

Figure 1:
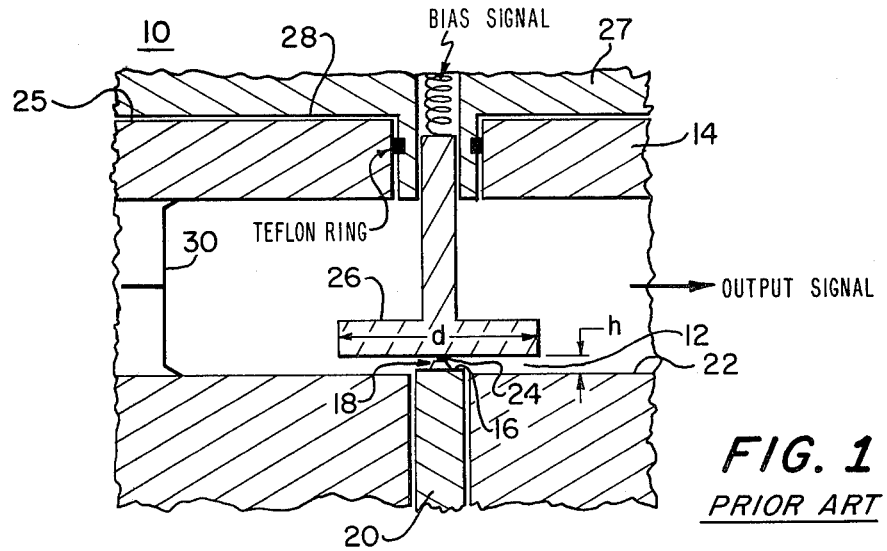
FIG. 1 is a schematic drawing of a prior art microwave oscillator.

Referring to FIG. 1, there is shown a schematic drawing of a prior art oscillator circuit 10 using a quarter wavelength radial disk cavity 12 housed in a section of waveguide 14 shown cross-sectioned along its longitudinal axis. The cathode 16 of an avalanche diode 18 operative in the IMPATT (Impact Ionization and Avalanche Transit-Time) mode is bonded to an end of a larger movable copper stud 20 which projects through the broad wall 22 of the waveguide 14 at ground potential. The anode 24 of the diode 18 is electrically connected to the center of a spring loaded disk 26. A D.C. bias signal from a source not shown, is applied to the diode 18 through a bias circuit including the spring loaded disk 26 in pressure contact with the anode 24 of the diode 18. A narrow gap 25 between the bias circuit housing 27 and the waveguide 14 forms an r.f. bypass capacitor 28 having a very low impedance suitable for reflecting electrical signals at the frequency of the microwave oscillations. The bypass capacitor 28 is arranged to prevent leakage of r.f. signals to the D.C. bias source. The disk 26 and broad wall 22 or floor of the waveguide form the quarter-wavelength radial cavity 12. The height, h, of the cavity 12 is adjusted by sliding the copper post 20 in or out of the waveguide 14. A sliding short 30 at one end of the waveguide 14 functions primarily as a matching element and is used for optimizing output power. Typically, the position of the short circuit 30 is about $\lambda/2$ behind the diode plane, where $\lambda$ is the guide wavelength at a desired operation frequency. The oscillation frequency is primarily determined by the disk diameter, d, cavity height, h, and the physical dimensions of the diode 18. The operating frequency of the oscillator 10 can be tuned or increased by decreasing the effective disk diameter, d, and thus the size of the radial cavity 12. However, it is generally accepted that good performance of the diode 18 over the tuning range is dependent on the presence of substantial negative resistance over a large range of diode transit angles. If the negative resistance of the diode 18 is lacking at frequencies within the calculated tuning range, the measured tuning range is diminished. This is observed in diode-cavity systems when the radial cavity 12 size is such as to force oscillations at very large or very small transit angles where the diode 18 does not exhibit substantial negative resistance. Generally, the disc diameter is very much larger than the diameter of the diode cathode terminal 16.

Figure 2:
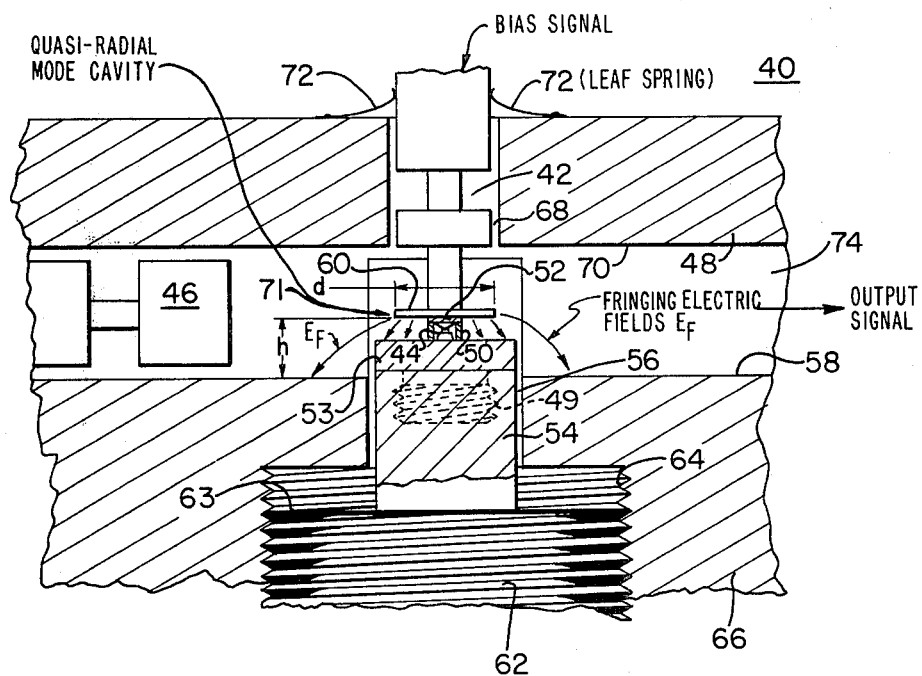
FIG. 2 is a schematic drawing of a millimeter oscillator arranged according to the invention.

Referring to FIG. 2, there is shown a schematic drawing of an oscillator circuit 40 according to the invention comprising a low pass filter 42, a transferred electron device TED 44, such as GaAs Gunn diode, capable of being triggered into oscillation by a D.C. bias signal and generating electrical signals a microwave/-millimeterwave frequencies, impedance matching elements 46, and a waveguide housing 48 all arranged according to the invention. The TED is assembled in a standard threaded copper heat sink package 49 having a ceramic standoff ring 50 and a first external terminal of the form of a conductive top cap 52. The heat sink package 49 at an end of a second external terminal or flange 53 is threaded into a frequency tuner 54 arranged to reciprocally move the TED in and out of an aperture 56 in the broad wall 58 (floor) of the waveguide 48. The top cap 52 is electrically connected to the center of a disc 60 adapted to move in consonance with the TED. By varying the height, h, or position of the disc 60 in the waveguide relative to the broad wall 58, an operator can vary the operating frequency of the oscillator 40. Means for providing smooth continuous frequency tuning by varying the height, h, of the disc 60 include forming small pitch threads 62 on a portion 63 of the tuner 54. The threaded portion 63 of the tuner 54 is engaged by matching threads 64 in a tuner housing 66 attached to the waveguide 48. The frequency tuner 54 is fabricated from a heat conducting material, such as beryllium copper, dimensioned to ensure heat generated by the operating TED 44 is safely conducted away or dissipated.

The D.C. bias voltage is coupled to the TED by way of a standard single section anodized aluminum r.f. choke or low pass filter 42 extending into the waveguide 48 through an aperture 68 in an opposite broad wall 70. The choke end-section is the disk 60. Leaf springs 72 may ride on a platform (not shown) which moves in correspondence with vertical movement of tuner 54 and engage choke 42. The diameter, d, of the disk 60 is carefully selected to be substantially equal to or less than the diameter of the flange 53. The disk 60 forms one face of a quarter wavelength, quasi-radial mode resonator. The TED flange 53 and broad wall 58 adjacent to the flange 53 form the other side of the resonator. The space between the disc 60 and flange 53 form a quasi-radial mode cavity 71. It is thought that the disc diameter, d, being substantially equal to or less than the flange 53 diameter concentrates an electric field, $E_F$, generated by the biased TED in the cavity 71 between the disc 60 and flange 53. The concentrated electric field, $E_F$, enables the TED to ultimately operate in a hybrid mode at a frequency an octave or more above the theoretically attainable operating frequency of the TED.

The impedance matching element 46 is a standard, non-contacting sliding short circuit and is located in the waveguide 48 behind the TED 44. The short circuit 46 is arranged to slide toward and away from the TED to adjust the coupling between the localized radial cavity 71 and a waveguide output port 74. Since the frequency of operation is primarily established by the radial region very close to the TED, the sliding short circuit 46 functions primarily as a means for matching the impedance of the TED 44 to the waveguide impedance. Maximum output power from the oscillator and minimum oscillator noise is attained when the short circuit 46 is located at an electrical distance of substantially an odd number of quarter wavelengths, $(2n+1)\lambda/4$, from the plane of the TED, $\lambda$ being the guide wavelength in waveguide 48 at the frequency of operation.

As stated above, frequency tuning is achieved by mechanically varying the height, h, of the disc 60 above the waveguide broad wall 58. It has been determined that inserting the TED 44 further into the waveguide 48 or increasing the disc 60 height, h, increases the magnitude of fringing electric field, $E_F$, to effectively increase the radial cavity 71 dimensions which results in a lower oscillation frequency.

By way of example of oscillator 40 construction and performance, a GaAs Gunn diode designed to operate in the range between 45 to 55 GHz was threaded into the frequency tuner 54. The Gunn diode had a flange diameter of substantially 0.118 inch and was inserted into WR-10 (0.100 inch $\times$ 0.050 inch) rectangular waveguide. A 0.030 inch conductive top cap of the diode was electrically connected to the center of the disc 60. Several discs having different diameters in the range of 0.065 inch to 0.075 inch were found to be satisfactory for oscillator operation. The oscillator had a continuous tuning range of substantially 20 GHz and operated between 75 and 110 GHz to provide a CW (continuous wave) output power signal of +10 dBm$\pm$1 dB. The position of the adjustable waveguide short circuit 46 was optimized at each frequency and was located substantially $5/4\lambda_g$ from the plane of the TED, where $\lambda_g$ is the wavelength in WR-10 rectangular waveguide at a desired operating frequency. The operating bias voltages, typically 4 to 5.5 v.d.c., were substantially higher than values calculated from transit-time considerations which suggests the Gunn diode is operating in a hybrid mode.

Variations of the novel oscillator circuit described herein will be suggested to those skilled in the microwave/millimeterwave art who may make numerous modifications of and departures from the exemplary structures described herein without departing from the inventive concepts. Consequently, the invention is to be construed as embracing each and every novel feature and novel combination of features present in or possessed by the apparatus and techniques herein disclosed and limited only by the spirit and scope of the appended claims.

What is claimed is:

1. Microwave/millimeter wave signal translating apparatus comprising:
    a waveguide transmission line having a predetermined impedance and a broad wall;
    a transferred electron device having a predetermined impedance and being adapted to operate at a first frequency, said device being disposed within said waveguide transmission line in a predetermined position with a first terminal having a flange generally parallel to said broad wall with a predetermined diameter electrically connected to ground potential and a second terminal electrically connected to a disc generally parallel to said broad wall disposed within said waveguide above said device, said disc being dimensioned to form a quarter wavelength quasi-radial mode cavity with said flange to enable said device to oscillate at a second frequency higher than said first frequency;
    means connected to said device for coupling a D.C. bias to said device to cause said device to oscillate at said second frequency;
    means connected to said device for varying said device and said disc position above said broad wall to vary said second frequency of device oscillation; and
    movable turning means disposed within and movable along the length of said waveguide substantially $(2n+1)\lambda/4$ from said device position for matching the impedance of said device to said predetermined impedance,
    $\lambda$ being the guide wavelength in said waveguide transmission line at said second frequency.

2. Microwave/millimeterwave signal translating apparatus in accordance with claim 1, wherein said disc has a diameter substantially less than said flange diameter.

3. Microwave/millimeterwave signal translating apparatus in accordance with claim 1, wherein said means for coupling said D.C. bias signal to said device include a low pass filter.

4. Microwave/millimeterwave signal translating apparatus in accordance with claim 3, wherein said disc is an end section of said low pass filter.

5. Microwave/millimeterwave signal translating apparatus in accordance with claim 1, wherein said device and said disc move in consonance.

6. Microwave/millimeterwave signal translating apparatus in accordance with claim 1, wherein said moveable tuning means includes a short circuit.

* * * * *